United States Patent [19]

Cave

[11] 4,333,056
[45] Jun. 1, 1982

[54] AUTOMATIC GAIN CONTROL CIRCUIT WITH NON-NEGATIVE EXPONENTIAL RELEASE

[75] Inventor: Ellis K. Cave, Garland, Tex.

[73] Assignee: Banc-By-Phone Corporation, Bannockburn, Ill.

[21] Appl. No.: 138,247

[22] Filed: Apr. 7, 1980

[51] Int. Cl.³ .............................................. H03G 3/30
[52] U.S. Cl. ..................................... 330/129; 330/279
[58] Field of Search ............... 330/278, 279, 280, 129, 330/138; 453/244

[56] References Cited

U.S. PATENT DOCUMENTS 3,620,631 11/1971 Stopka et al. ..................... 455/244
3,879,674 4/1975 Dragon ............................... 330/280

Primary Examiner—James B. Mullins
Assistant Examiner—Gene Wan
Attorney, Agent, or Firm—Granger Cook, Jr.; Edward D. Manzo

[57] ABSTRACT

An automatic gain control circuit wherein the gain progressively increases in increasingly larger magnitudes. The illustrative embodiment includes an amplifier whose gain is related by a voltage follower to the voltage on a capacitor in a feedback loop. A rectifier develops a signal representing the AGC output level which is compared against a threshold value. A current source, arranged in a further feedback loop with the capacitor and the voltage follower, increases the voltage on the capacitor as a function of that voltage. The second derivative with respect to time of such function is non-negative. To ensure that there exists a voltage on the capacitor upon which the current source can operate, a starting circuit provides a small, non-zero voltage to the capacitor.

19 Claims, 1 Drawing Figure

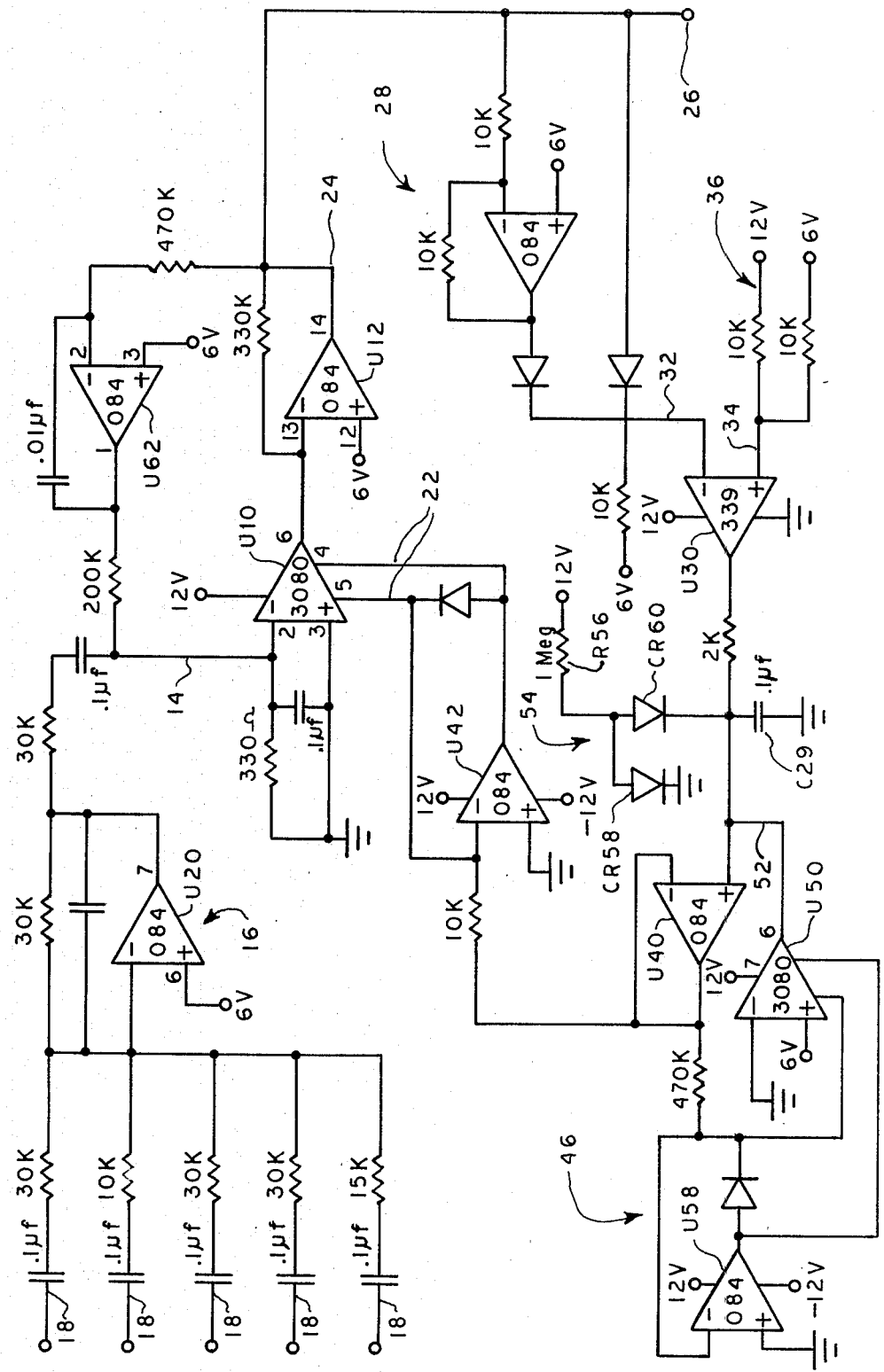

AUTOMATIC GAIN CONTROL CIRCUIT WITH NON-NEGATIVE EXPONENTIAL RELEASE

BACKGROUND OF THE INVENTION

The present invention relates to automatic gain control circuits. The embodiment described illustratively herein is particularly suitable for audio signals, but it will be understood that the present invention will find applicability in other environments.

Typical AGC circuits pass inputted signals through a variable gain amplifier to an output. A feedback circuit adjusts the gain on the amplifier, and generally the gain follows a voltage on a capacitor. Usually a comparison circuit receives signals representing the level of the output signal and compares the representative signal against a threshold value. If the signal level is too high, the comparison circuit permits the capacitor to discharge to ground, and the gain will decrease. If the gain is too low, the comparison circuit will present a high impedance to the capacitor. The voltage on the capacitor will increase through the action of current flow from a voltage source tied to the capacitor through a resistor. The voltage on the capacitor will develop according to the well-known RC curve which is a negative exponential curve, i.e, its second derivative with respect to time is negative.

As a result, when the gain is increasing in prior art AGC circuits, the RC curve and hence the gain change is steep initially and progressively decreases in slope. This characteristic tends to distort low frequency components of the signal. The sound which results is unpleasant to the ear. To compensate for this, most AGC circuits increase the RC time constant so that the initial rapid change in gain is tolerable, which lengthens considerably the recovery time of the circuit.

However, this solution has not been entirely successful. When a signal at a high level drops to a low level, the low level audio signal will be entirely lost for a time, due to the slow recovery time.

It is therefore an object of the present invention to provide an AGC circuit which has a fast recovery time without substantially distorting low frequency components of the signal.

SUMMARY OF THE INVENTION

According to the present invention, an AGC circuit is provided which inputs signals to a gain controllable amplifier. Control means such as a feedback circuit adjusts the gain of the amplifier. For increasing the gain, the gain control circuit initially increases the gain by increasingly larger amounts. If the gain should be decreased, the gain control circuit decreases the amplifier gain.

Alternatively, the gain, when increasing, at least initially increases so that the second derivative of the gain with respect to time is non-negative.

In one illustrative analog embodiment, it being understood that the present invention could be embodied digitally, the gain when increasing follows a positive exponential curve. This is achieved by the action of a storage device such as a capacitor in cooperation with exponent generator means, such as a current source, for increasing the value stored in the storage device. The voltage on the capacitor determines both (a) the gain of the amplifier, and (b) the rate at which gain will be increased (by the current source adding charge to the capacitor).

A voltage follower coupled to the capacitor will develop a signal, without disturbing significantly the voltage on the capacitor, to control the gain of the amplifier. The voltage follower circuit provides an input to the current source which, in turn, provides a current to the capacitor to increase the voltage level thereof. As a result of the increasing voltage level, the gain will increase.

Ultimately, the level of the output signal will exceed a threshold value for a comparison circuit in the feedback circuit. The comparison circuit will permit the capacitor to discharge. The gain will be adjusted downward accordingly.

It will be understood that circuitry could be provided within the scope of the invention for increasing the gain according to various functions, such as according to any non-negative exponent of either a transcendental or non-transcendental number, for example.

BRIEF DESCRIPTION OF THE DRAWINGS

Further features and advantage of the invention will become more apparent and greater understanding will be obtained from the following detailed description of a preferred embodiment wherein reference is made to the accompanying FIGURE which is a schematic diagram of an AGC circuit according to the present invention.

DESCRIPTION OF A PREFERRED EMBODIMENT

Referrinfg to the FIGURE, the AGC circuit includes a gain-controllable amplifier arrangement comprising operational amplifiers U-10 in series connection with U-12. The signal inputted to the amplifier is inputted on a lead 14 which is coupled to an input circuit 16. Input circuit 16 can receive any one or several of a plurality of input signals on any one of five input leads 18 which are capacitively coupled to an input amplifier U-20. The output of amplifier U-20 is coupled by lead 14 to the gain controllable amplifier arrangement, as shown. The output of the amplifier arrangement is coupled by a lead 24 to an AGC circuit output 26.

The gain of the amplifier arrangement U-10 and U-12 is controlled by current on leads 22. The current developed on leads 22 will be explained infra. It is to be understood, however, that amplifier arrangements whose gain responds to other parameters, for example voltage, may be used in the scope of the present invention.

Gain control means are responsively coupled to receive signals from within the AGC circuit for automatically determining whether the gain should be increased or decreased and for controlling the gain of the amplifier arrangement, U-10 and U-12 accordingly. Such means comprises a feedback circuit whose input is coupled to output 26. The control means includes signal level means, illustratively a full wave rectifier 28, for developing a signal representative of the signal level at the AGC output 26. The illustrative full wave rectifier is standard in design. Those in the art will appreciate that other arrangements can be devised for developing a signal which represents the output level.

The gain control means illustrated in the FIGURE includes a storage device for storing a data value inputted thereto. The gain of amplifier arrangement U-10 and U-12 will be in accordance with the stored data value. In this illustrative analog embodiment, the storage device may comprise a capacitor C29. Means, such as a comparison circuit 30, cooperates with the storage device so that the data stored in or on the storage device may be decreased in magnitude.

Comparison circuit U-30 is coupled at one input 32 to receive the full wave rectified signal which represents the level of the AGC output. A second input 34 determines a threshold value for the AGC circuit and, illustratively, is set at nine volts. This is achieved in the FIGURE by a voltage divider 36. Amplifier U-30 is an open collector comparator which it is well-known to those in the art. In operation, it presents a low impedance path by which capacitor C29 discharges to ground if the full wave rectified signal on input 32 exceeds the threshold value on input 34. If, on the other hand, the signal on input 32 is below the threshold value on input 34, then comparison circuit U-30 presents a high impedance output through which capacitor C29 does not significantly discharge.

If the level of the output signal is too great, that is, greater than the nominal nine volt threshold value, then capacitor C29 discharges to ground, as mentioned. A voltage follower U-40 is coupled to capacitor C29 and develops a voltage following the voltage thereon. This voltage is inputted to a voltage-to-current converter U-42. The output of converter U-42 is a current developed on leads 22 which, as mentioned supra, control the gain of the amplifier U-10 and U-12. It will be understood that the amplifier arrangement could be considered to include converter U-42, in which case the amplifier would be voltage controlled rather than current controlled. A third alternative would be to include converter U-42 and amplifier U-10 in the gain control means which control the gain of amplifier U-12.

In response to an automatic determination that gain should be increased, that is, the level of the output signal is less than nine volts, the AGC circuit of the present invention increases the gain by an exponential function through the operation of an exponent generator such as a current source 46 coupled to voltage follower U-40 and capacitor C29. The gain is increased in progressively larger amounts, illustratively in a direct relationship with the voltage on capacitor C29. This is achieved by current source 46 developing a current proportional to the voltage outputted by voltage converter U-40. Current source 46 by itself is conventional in design and comprises operational amplifiers U-48 and U-50 which together develop an output on lead 52. This lead 52 is coupled to capacitor C29 and will increase the charge and voltage stored thereon. It will be appreciated that the increase in voltage on capacitor C29 will be directly proportional to the voltage thereon.

Means are provided for insuring that the gain control signals developed by the gain control circuit are not zero. More specifically, such means prevents the voltage stored on capacitor C29 from remaining at zero. A starting circuit 54 achieves this. Illustratively, starting circuit 54 comprises a fairly high resistance R-56 in series with a diode CR-58 coupling a 12 volt potential to ground. A further diode CR-60 has its anode coupled to the anode of CR-58. The cathode of CR-60 is coupled to capacitor C29 so that a very small voltage, approximately the barrier voltage of the diode, is presented to capacitor C29. If the voltage on C29 ever reached zero, the starting circuit would elevate the voltage thereover, so that the current source would operate.

Finally, means are provided to stabilize the DC level at output 26. An operational amplifier U-62 arranged in a feedback loop with amplifier U-10 and U-12 has its inverting input coupled to lead 24. The non-inverting input is coupled to, illustratively, a six volt source, and the output of amplifier U-62 is fed back to the inverting input of amplifier U-10. Accordingly, whenever the DC output level of amplifier U-12 is not six volts DC, amplifier U-62 injects a correction voltage into amplifier U-10 to compensate. The reason for inclusion of this stabilization circuit is that as the gain changes in the amplifier arrangement, DC level tends to shift.

Those who are skilled in the art will appreciate that the numerous changes can be made in the embodiment illustratively described herein. For example, the current source 46 may generate current at different rates then the rate described illustratively herein. Such a rate could be any rate in which the initial voltage increase on capacitor C29, and therefore the increase in gain of the amplifier arrangement U-10 and U-12, is not steep. A variety of functions whose second time derivatives are non-negative can achieve this, for example, squaring, cubing or other functions.

It will also be appreciated that the present invention could be embodied digitally. Such an embodiment would include some form of storage device such as a counter, random access memory or shift register, for example, in which data would be stored and periodically updated. Means would be provided to determine whether the gain should be increased or decreased. If the gain should be increased, the data stored in the storage device should be adjusted accordingly. When gain is to increase, the stored data value should change at a rate whose second time derivative is positive, or so that at least initially, it progressively increases in increasingly larger amounts. The exponent generator or current source 46 could take the form of an arithmetic circuit, such as a multiplier or adder which increments the storage device according to a preselected function. The data value stored in the storage device would control the gain of a suitable amplifier arrangement. Such a digital embodiment, and variations thereof, are within the scope of the present invention.

If will be appreciated that other changes, modifications or alterations are within the scope of the present invention which is defined by the appended claims.

What is claimed is:

1. An automatic gain control (AGC) circuit for providing gain-controlled signal at an output related to signals received at an input, comprising:
   gain-controllable amplifier means having an output coupled to the AGC output;
   means coupling the AGC input to an input of said amplifier means; and
   gain control means responsively coupled to receive signals from within the AGC circuit for automatically determining whether the gain should be increased or decreased, and for controlling said amplifier means with control signals which progressively increase in increasingly larger magnitudes, at least initially, if the gain should be increased, and which decrease if the gain should be decreased.

2. The AGC circuit of claim 1 wherein said gain control means comprises:
   signal level means for developing signal representative of the signal level at the AGC output;
   a storage device for storing a data value inputted thereto;
   means responsively coupled to said signal level means for decreasing the value stored in said storage device substantially only response to the representative signal exceeding a predetermined threshold value; and means for providing gain control signals which are a function of the value stored in said storage device.

3. The AGC circuit of claim 2 wherein said means for providing gain control signals includes exponent generator means for increasing the data value stored in said storage device as a non-negative exponential function of said data value.

4. The AGC circuit of claim 3 wherein said storage device is a capacitor and wherein said means for providing gain control signals further includes a voltage follower responding to the voltage on said capacitor, said voltage follower providing signals to said exponent generator means.

5. The AGC circuit of claim 3 further comprising means for ensuring that said gain control signals do not remain at zero.

6. The AGC circuit of claim 5 wherein said ensuring means comprises starting circuit means for providing a small data value to said storage device.

7. The AGC circuit of claim 6 wherein said storage device is a capacitor and wherein said starting circuit means couples a small nonzero voltage to said capacitor.

8. The AGC circuit of claim 2, 3 or 4 wherein said storage device is a capacitor, and wherein said decreasing means comprises comparison means for receiving and comparing said representative signal against a threshold value, said comparison means permitting said capacitor to discharge through a low impedance if said representative signal exceeds said threshold value, and presenting a high impedance to said capacitor if said representative signal does not exceed said threshold value.

9. The AGC circuit of claim 8 wherein said means for developing a representative signal is a rectifier.

10. The AGC circuit of claim 1 or 3 further comprising means cooperating with said amplifier means for maintaining the DC output level at a relatively constant value.

11. In an automatic gain control circuit of the type having an input for receiving signals, a gain-controllable amplifier means for providing adjusted gain signals to an output, and a feedback circuit coupled to the AGC output and having a capacitor therein, the feedback circuit controlling the gain of the amplifier in accordance with the voltage on the capacitor, the feedback circuit having means for discharging the capacitor substantially only if the output signal exceeds a predetermined threshold value, and having means for charging the capacitor, the improvement comprising:

means for ensuring that a small but nonzero voltage will be on the capacitor; and means associated with the feedback circuit for increasing the voltage on the capacitor as a function of the voltage thereon, the second derivative of said function with respect to time being non-negative.

12. The improvement of claim 11 wherein said means for controlling gain includes a voltage follower coupled to the capacitor and wherein said means for increasing voltage is a current source arranged in a feedback loop having an input coupled to an output of said voltage follower and having an output coupled to the capacitor.

13. The improvement of claim 12 wherein said means for controlling gain further includes a voltage to current converter coupling said voltage follower to the amplifier means, and wherein the amplifier means is current-controlled.

14. The improvement of claim 12 wherein said means for ensuring comprises a low voltage source coupled to the capacitor.

15. The improvement of claim 11 further comprising a second feedback circuit means, cooperating with the amplifier means, for maintaining the DC output level of the AGC circuit relatively constant.

16. A method for automatic gain control of a signal level comprising:

automatically determining whether the signal level should be increased or decreased;

if the signal level should be increased, then adjusting the gain so that its second derivative with respect to time, at least initially, is positive; and if the signal level should decrease, then decreasing the signal level.

17. A method for automatic gain control of a signal level comprising:

automatically determining whether the signal level should be increased or decreased;

if the signal level should be increased, then progressively increasing the gain in increasingly larger amounts for selected times;

if the signal level should be decreased, then decreasing the gain.

18. The method of claim 16 or 17 wherein said increasing step includes:

developing a small nonzero voltage on a capacitor; and increasing the gain by an amount proportional to the voltage on said capacitor without substantially decreasing the voltage thereon.

19. The method of claim 16 or 17 wherein said automatically determining step comprises:

comparing a signal related to the magnitude to be controlled against a threshold value;

allowing said capacitor to discharge if the magnitude exceeds the threshold; and otherwise presenting a high impedance to said capacitor to prevent significant discharge thereof.

* * * * *